(12) United States Patent
Krishnan et al.

(10) Patent No.: US 9,165,767 B2
(45) Date of Patent: Oct. 20, 2015

(54) SEMICONDUCTOR STRUCTURE WITH INCREASED SPACE AND VOLUME BETWEEN SHAPED EPITAXIAL STRUCTURES

(71) Applicant: GLOBALFOUNDRIES Inc., Grand Cayman, KY (US)

(72) Inventors: Bharat Krishnan, Mechanicville, NY (US); Jody A. Fronheiser, Delmar, NY (US); Jinping Liu, Hopewell Junction, NY (US); Bongki Lee, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/071,170

(22) Filed: Nov. 4, 2013

(65) Prior Publication Data

US 2015/0123146 A1    May 7, 2015

(51) Int. Cl.

| H01L 21/02 | (2006.01) |
|---|---|
| H01L 29/06 | (2006.01) |
| H01L 29/16 | (2006.01) |
| H01L 29/78 | (2006.01) |
| H01L 29/165 | (2006.01) |

(52) U.S. Cl.
CPC ........ *H01L 21/0243* (2013.01); *H01L 21/0262* (2013.01); *H01L 21/02433* (2013.01); *H01L 21/02532* (2013.01); *H01L 21/02587* (2013.01); *H01L 21/02609* (2013.01); *H01L 21/02639* (2013.01); *H01L 29/0657* (2013.01); *H01L 29/16* (2013.01); *H01L 29/165* (2013.01); *H01L 29/1608* (2013.01); *H01L 29/785* (2013.01)

(58) Field of Classification Search
CPC ........ H01L 27/085; H01L 21/20; H01L 29/24
USPC ............... 257/77, 401, E29.104, E27.059; 438/478
See application file for complete search history.

(56) References Cited

U.S. PATENT DOCUMENTS

| 2010/0163840 A1* | 7/2010 | Seifert et al. ............ 257/13 |
| 2013/0093026 A1* | 4/2013 | Wann et al. ............ 257/401 |
| 2013/0193446 A1* | 8/2013 | Chao et al. ............ 257/77 |

* cited by examiner

*Primary Examiner* — Caleb Henry
(74) *Attorney, Agent, or Firm* — Wayne F. Reinke, Esq.; Heslin Rothenberg Farley & Mesiti P.C.

(57) ABSTRACT

A semiconductor structure includes a bulk silicon substrate and one or more silicon fins coupled to the bulk silicon substrate. Stress-inducing material(s), such as silicon, are epitaxially grown on the fins into naturally diamond-shaped structures using a controlled selective epitaxial growth. The diamond shaped structures are subjected to annealing at about 750° C. to about 850° C. to increase an area of (100) surface orientation by reshaping the shaped structures from the annealing. Additional epitaxy is grown on the increased (100) area. Multiple cycles of increasing the area of (100) surface orientation (e.g., by the annealing) and growing additional epitaxy on the increased area are performed to decrease the width of the shaped structures, increasing the space between them to prevent them from merging, while also increasing their volume.

14 Claims, 3 Drawing Sheets

SEMICONDUCTOR STRUCTURE WITH INCREASED SPACE AND VOLUME BETWEEN SHAPED EPITAXIAL STRUCTURES

BACKGROUND OF THE INVENTION

1. Technical Field

The present invention generally relates to semiconductor devices and methods of fabricating semiconductor devices, more particularly, to methods of reducing merging of semiconductor epitaxial growth on adjacent fins of a FinFET.

2. Background Information

Three-dimensional field-effect transistors (FinFETs) are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more transistors or other semiconductor devices, such as passive devices, including capacitors, diodes, etc. As the density of semiconductor integrated circuits increases and the corresponding size of circuit elements decreases, significant challenges may arise, due to issues related to, for instance, merging of semiconductor epitaxial growth on adjacent fins of a FinFET, resulting in challenges such as, for instance, contact spiking.

Accordingly, a need exists to reduce merging of semiconductor epitaxial growth on adjacent fins of a FinFET.

SUMMARY OF THE INVENTION

The shortcomings of the prior art are overcome and additional advantages are provided through the provision, in one aspect, of a method of reducing or eliminating merging of epitaxy grown on adjacent fins of a FinFET. The method includes providing a semiconductor structure, the structure including a semiconductor substrate and a plurality of semiconductor fins coupled to the semiconductor substrate. The method further includes growing epitaxy on a top surface of the plurality of semiconductor fins, the epitaxy on adjacent fins being separated by a space, and modifying the epitaxy to increase the space between adjacent epitaxy while increasing a volume of the epitaxy.

In accordance with another aspect, a semiconductor structure includes a semiconductor substrate, a plurality of raised semiconductor structures coupled to the substrate, and a plurality of shaped epitaxial structures of a semiconductor material on top surfaces of the plurality of raised semiconductor structures, the shaped epitaxial structures on adjacent raised structures being separated by a space, and the shaped epitaxial structures are modified to be taller and less wide by performing at least one cycle of annealing followed by further epitaxial growth as compared to an initial epitaxial growth to have greater volume and greater space between adjacent shaped epitaxial structures.

In accordance with yet another aspect, a non-planar semiconductor transistor includes a semiconductor substrate, a plurality of raised semiconductor structures coupled to the semiconductor substrate, a source, a drain and a channel on a surface of the plurality of raised semiconductor structures opposite the semiconductor substrate, the source, the drain and the channel each including a plurality of shaped epitaxial structures of a semiconductor material, the plurality of shaped epitaxial structures on adjacent raised structures being separated by a space, and the shaped epitaxial structures are modified to be taller and less wide by performing at least one cycle of annealing followed by further epitaxial growth as compared to an initial epitaxial growth to have greater volume and greater space between adjacent shaped epitaxial structures.

These, and other objects, features and advantages of this invention will become apparent from the following detailed description of the various aspects of the invention taken in conjunction with the accompanying drawings.

DETAILED DESCRIPTION OF THE INVENTION

Figure 1:
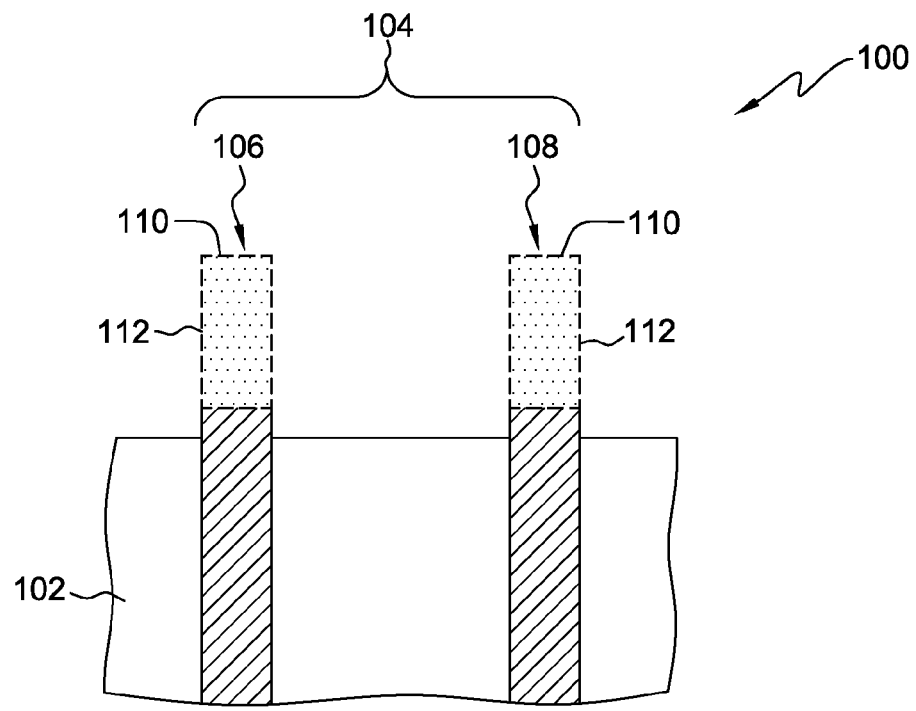
FIG. 1 is a cross-sectional elevational view of one example of an intermediate semiconductor structure, including two adjacent semiconductor fins coupled to a semiconductor substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"

(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional elevational view of one example of a semiconductor structure, generally denoted by 100, obtained at an intermediate stage of semiconductor fabrication. At the stage of fabrication depicted in FIG. 1, the semiconductor structure 100 includes a semiconductor substrate 102, such as a bulk semiconductor material, for example, a bulk silicon wafer in a crystalline structure with any suitable crystallographic orientation. Suitable orientations include, for example, (100) and (110) orientations. In the present example, the semiconductor substrate has a planar (100) crystallographic surface orientation (referred to as "(100)" surface) and, where the semiconductor substrate is a wafer, may further include a notch (not shown) at an edge of the wafer, along any suitable direction, such as, for example <110> (most popular) or <100> direction. Note that the crystal direction is indicated by "<100>," while the crystal surface is denoted by (100). In one example, semiconductor substrate 102 may include any silicon-containing substrate including, but not limited to, silicon (Si), single crystal silicon, polycrystalline Si, amorphous Si, silicon-on-nothing (SON), silicon-on-replacement insulator (SRI), silicon-on-oxide or silicon-on-insulator (SOI), silicon-germanium-on-insulator (SGOI) substrates and the like. Semiconductor substrate 102 may in addition or instead include various isolations, dopings and/or device features. The semiconductor substrate may include other suitable elementary semiconductors, such as, for example, germanium (Ge), a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Continuing with FIG. 1, semiconductor structure 100 includes multiple raised semiconductor structures, referred to as "fins" 104, e.g., semiconductor fins 106 and 108 coupled to semiconductor substrate 102. As one skilled in art will understand, where semiconductor substrate 102 is a semiconductor wafer including an orientation notch (in <110> or <100> directions), semiconductor fins 104 may be positioned substantially parallel or perpendicular to the direction as defined by the notch (or flat) pointing to <110> or <100> direction. Semiconductor fins 104 may exhibit a rectangular shape with a top surface 110 having a (100) crystallographic surface orientation and a (110) crystallographic surface for the sidewall surfaces 112 in case the notch pointing to <110> direction. Alternatively, the crystallographic orientation of the top surface 110 and the sidewall surface 112 of semiconductor fins 104 may include a (100) surface orientation, in the case of the substrate including a notch aligned toward <100> direction.

Figure 2:
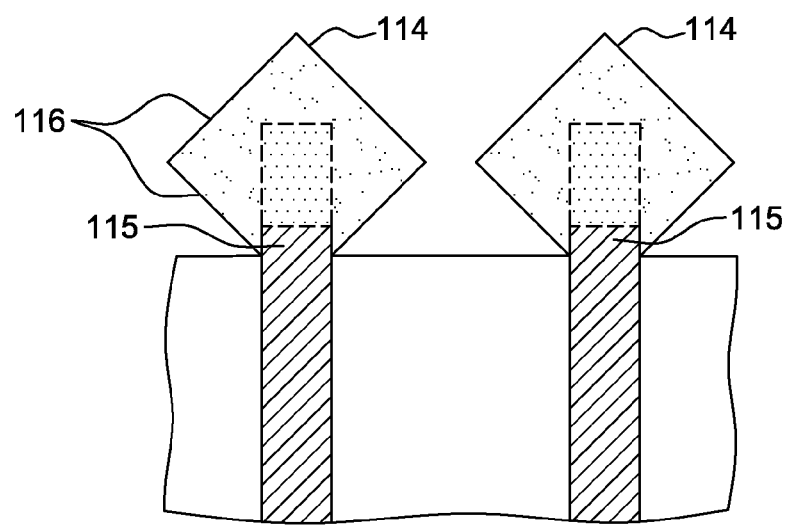
FIG. 2 depicts one example of the intermediate structure of FIG. 1 with epitaxy grown on a top surface of each of the semiconductor fins, in accordance with one or more aspects of the present invention.

As depicted in FIG. 2, one or more stress-inducing materials 114 (i.e., materials inducing stress on the channel) may be epitaxially grown on the exposed portion of the semiconductor fins, e.g., fin 115, using, for instance, a controlled selective epitaxial growth (SEG) process. Stress-inducing material(s) 114 may include, in one example, substantially similar material as that of semiconductor fins 104, the substantially similar material, for instance, being pure silicon. In another example, stress-inducing material(s) 114 that are epitaxially grown may be substantially different material from that of semiconductor fins 104. In such an example, the stress inducing material may include one or more tensile stress-inducing material(s) or one or more compressive stress-inducing material(s). As understood, "controlled" in this context (i.e., controlled SEG process) means that the conventional process conditions, such as, for instance, time, for which the SEG process is performed, is typically controlled and limited to the desired size of the resultant epitaxial growth.

In one example where the substrate and fins are silicon-based, the tensile stress-inducing material(s) may include, but are not limited to, silicon doped with carbon and phosphorus Si:C(P), where the atomic percentage of carbon may be about 1 percent to about 3 percent or silicon doped with phosphorus (SiP), where the atomic percentage of phosphorus may vary, for instance, between 0.1 percent to about 10 percent. The term "tensile stress inducing material" denotes a material layer having an intrinsic tensile stress, in which the intrinsic tensile stress produces a tensile stress in one or more adjacent materials. The tensile stress-inducing material(s) are epitaxially grown using selective epitaxial growth via various methods such as, for example, chemical vapor deposition (CVD), remote-plasma chemical vapor deposition (RPCVD), low-pressure chemical vapor deposition (LPCVD) or other applicable methods. The controlled selective epitaxial growth starts when at least one semiconductor source gas is injected into the reaction chamber. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC.

In another example, compressive stress-inducing material(s) may include, but are not limited to, germanium (Ge) and silicon germanium (SiGe) where the atomic percentage of germanium may vary, for instance, between about 0.1 percent to about 100 percent, and may be epitaxially grown above the silicon (Si). The term "compressive stress-inducing material" denotes a material having an intrinsic compressive stress, in which the intrinsic compressive stress produces compressive stress in one or more adjacent materials. The epitaxial growth may be realized using controlled selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be same as above for silicon source with a combination of $GeH_4$ or $Ge_2H_6$, or for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

Continuing with FIG. 2, one skilled in art will understand that the controlled selective epitaxial growth of semiconductor fins 104 will often result in forming different resultant shapes, owing to different growth rates on different crystal surface planes or orientations. Note that the growth rate on, for instance, semiconductor silicon (Si) surfaces having (111) orientations (angled surfaces) is slower than that on other planes, such as (110) or (100) planes. During the epitaxial growth, a thin epitaxial layer may begin to form around the (110) surface orientation of the fins, with the growth sticking out from the sidewall surface of semiconductor fins 104. As the growth continues, it may be limited by the (111) surface orientation, gradually resulting in a diamond shape, having (111) surface orientation on the sidewalls 116 of the epitaxial growth. Accordingly, this controlled selective epitaxial growth results in forming a diamond shape naturally, owing to the slowest epitaxial growth rate on (111) surface, and the size of the resultant diamond shape is determined by the time for which the selective epitaxial growth has been performed. In a specific example, the controlled selective epitaxial growth process may be performed for about 100 sec to about 600 sec.

Figure 3:
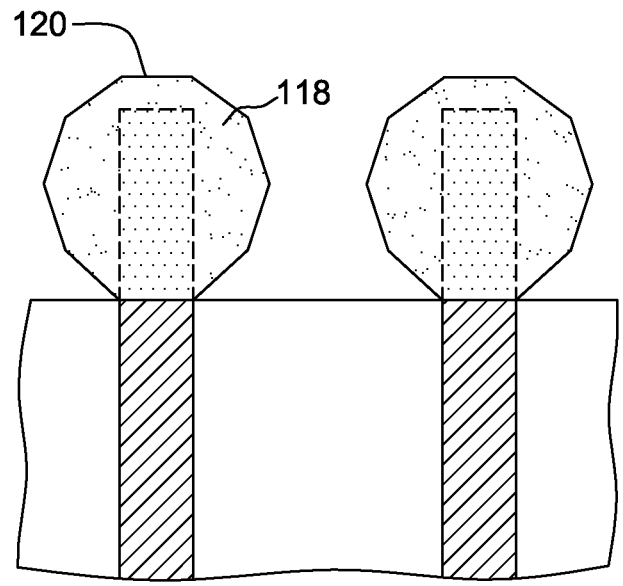
FIG. 3 depicts one example of the intermediate structure of FIG. 2 after annealing the epitaxial growth, in accordance with one or more aspects of the present invention.

FIG. 3 depicts the structure of FIG. 2 after subjecting stress-inducing material(s) 114 (see FIG. 2), epitaxially grown over semiconductor fins 104, to a further modification process, annealing to modify the surface orientation of the stress-inducing material(s), which modifies the shape due to silicon reflow at higher temperatures. Note that this modification process of stress-inducing material(s) facilitates in increasing an area of (100) surface orientation in preparation for growing additional epitaxy on the increased (100) surface orientation. In one example, the annealing of stress-inducing material(s) 114 (see FIG. 2) may be performed at a temperature of about 750° C. to about 850° C. As discussed above and understood by one skilled in art, different growth rates on different crystal surface planes or orientations result in forming different shaped epitaxial structures. Accordingly, this modification process performed by annealing the stress-inducing material(s) 114 of FIG. 2, causes a change in shape to, for example, shaped structures 118, for instance, a rounding of the diamond shaped structure, resulting in the increased area of (100) surface orientation 120 for a subsequent additional epitaxial growth. Although not critical to the invention, in one example, the process of epitaxially growing shaped structures over semiconductor fins discussed in connection with FIG. 2 may be performed in the same process chamber as the modification process performed to change the surface orientation of the shaped structures and increase the area of surface orientation 120, resulting in a cost-effective fabrication step.

Figure 4:
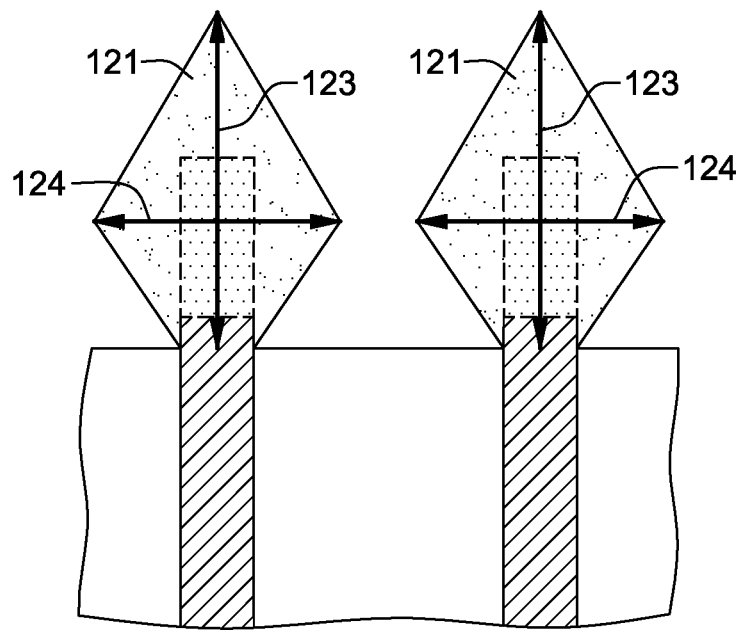
FIG. 4 depicts one example of the intermediate structure of FIG. 3 after an additional epitaxial growth process, in accordance with one or more aspects of the present invention.

FIG. 4 depicts the structure of FIG. 3 after subjecting the rounded shaped structures 118 (see FIG. 3) to an additional epitaxial growth process that is substantially similar to the process discussed in connection with FIG. 2. One or more additional stress inducing materials 121 are epitaxially re-grown on rounded shaped structures 118 of FIG. 3 using, for instance, a controlled selective epitaxial growth (SEG) process. As discussed above, additional stress-inducing material(s) 121 may include, in one example, a substantially similar material as stress-inducing material(s) 114 of FIG. 2. In one example, the controlled SEG process conditions performed may be substantially similar to the SEG process conditions employed in connection with FIG. 2. Note that this additional epitaxial growth process facilitates in increasing longitudinal height 123, while decreasing lateral width 124 and increasing overall volume of the epitaxy. Roughly speaking, the shape is that of an elongated diamond.

Figure 5:
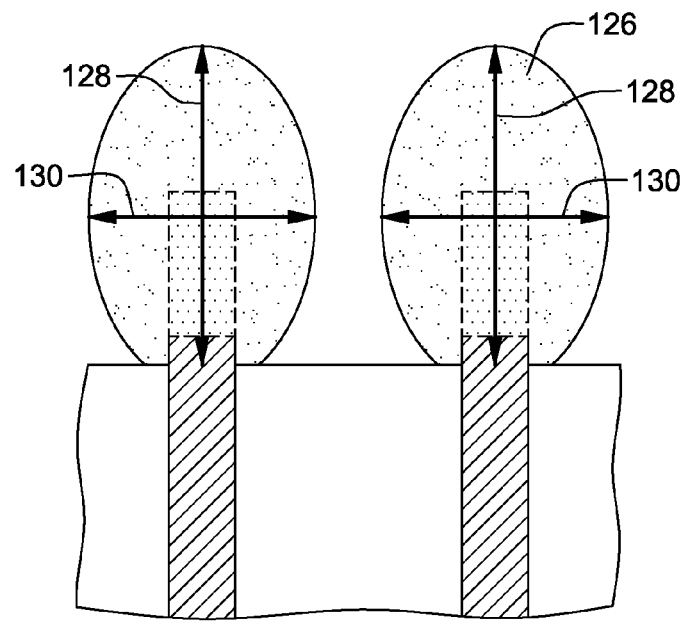
FIG. 5 depicts one example of the intermediate structure of FIG. 4 after another cycle of in-situ annealing, in accordance with one or more aspects of the present invention.

FIG. 5 depicts the structure of FIG. 4 after another cycle of in-situ annealing. Note that the resultant structure 126 has a roughly oval shape, where the height 128 is greater than a width 130 thereof. In one specific example using silicon, the height is about 2 nm to about 4 nm greater than the width.

Figure 6:
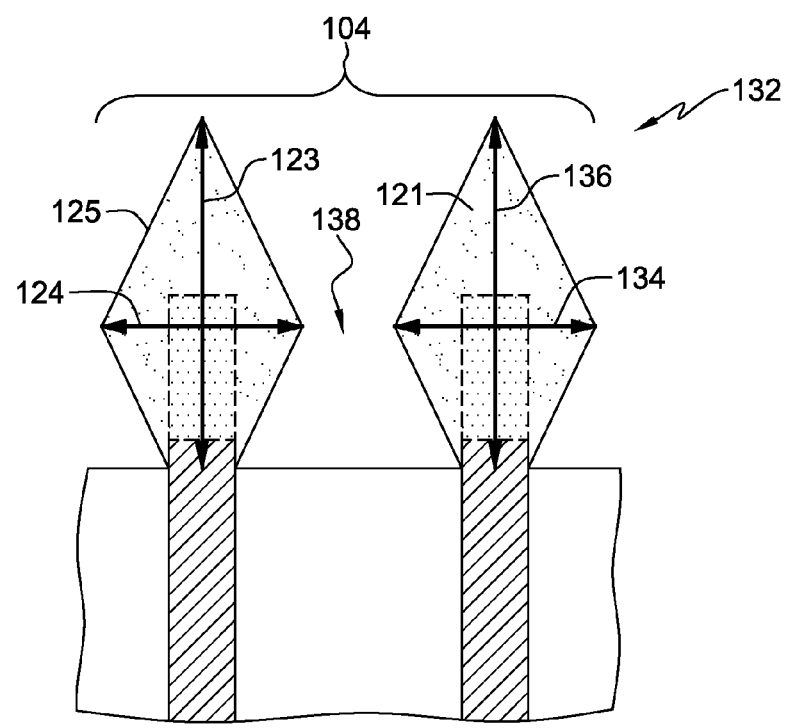
FIG. 6 depicts one example of the resulting structure of FIG. 5 after multiple cycles of annealing and epitaxial growth, in accordance with one or more aspects of the present invention.

FIG. 6 depicts the resultant structure 132 after performing multiple cycles of in-situ annealing and regrowth on the increased area of (100) surface orientation 120 (see FIG. 2) of epitaxial stress-inducing material(s) 114 (see FIG. 2). Note that these multiple cycles of annealing and growth processes advantageously facilitate in (effectively) stretching or elongating the shaped epitaxial structures, to reduce their width 134, while increasing their height 136 and overall volume. The shaped epitaxial structures on adjacent raised structures are separated by a space 138, and have a height 136 that is greater than their width 134, a characteristic of the elongated shape.

In a further embodiment, although not depicted in figures, one skilled in art will note that, advantageously, the fabrication technique described herein may also be applied to fins having various recesses, including recesses below an oxide level. For example, embedded stress-inducing materials may be grown epitaxially within one or more cavities such as, for example, sigma-shaped-cavities, of recessed semiconductor fins. In a specific example, embedded stress-inducing materials may be epitaxially grown by performing multiple cycles of in-situ annealing and regrowth, thereby resulting in increasing their respective height, while reducing their width and, in turn, increasing the overall volume of the embedded stress-inducing materials within the sigma-shaped cavities of the recessed semiconductor fins.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A semiconductor structure, comprising:
   a semiconductor substrate;
   a plurality of raised semiconductor structures coupled to the substrate; and
   a plurality of shaped epitaxial structures of a semiconductor material on top surfaces of the plurality of raised semiconductor structures, wherein the shaped epitaxial structures on adjacent raised structures are separated by a space, and wherein the shaped epitaxial structures are modified to be taller and less wide by performing at least one cycle of annealing followed by further epitaxial growth as compared to an initial cycle of epitaxial growth to have greater volume and greater space between adjacent shaped epitaxial structures.
2. The semiconductor structure of claim 1, wherein the semiconductor material of the shaped epitaxial structures comprises silicon.

3. The semiconductor structure of claim 1, wherein the semiconductor material of the shaped epitaxial structures comprises Silicon-Germanium (SiGe).

4. The semiconductor structure of claim 1, wherein the semiconductor material of the shaped epitaxial structures comprises Germanium (Ge).

5. The semiconductor structure of claim 1, wherein the semiconductor material of the shaped epitaxial structures comprises Phosphorus doped Silicon Carbon (SiC:P).

6. The semiconductor structure of claim 1, wherein the semiconductor material of the shaped epitaxial structures comprises Phosphorus doped Si.

7. The semiconductor structure of claim 1, wherein the at least one cycle comprises a plurality of cycles of annealing followed by further epitaxial growth.

8. A non-planar semiconductor transistor, comprising:
a semiconductor substrate;
a plurality of raised semiconductor structures coupled to the semiconductor substrate;
a source, a drain and a channel on a surface of the plurality of raised semiconductor structures opposite the semiconductor substrate, wherein the source, the drain and the channel comprise a plurality of shaped epitaxial structures of a semiconductor material; and
wherein the plurality of shaped epitaxial structures on adjacent raised structures are separated by a space, and wherein the shaped epitaxial structures are modified to be taller and less wide by performing at least one cycle of annealing followed by further epitaxial growth as compared to an initial epitaxial growth to have greater volume and greater space between adjacent shaped epitaxial structures.

9. The non-planar semiconductor transistor of claim 8, wherein the semiconductor substrate comprises a bulk silicon substrate, and wherein the semiconductor material of the shaped epitaxial structures comprises silicon.

10. The non-planar semiconductor transistor of claim 8, wherein the semiconductor substrate comprises a bulk silicon substrate, and wherein the semiconductor material of the shaped epitaxial structures comprises Silicon-Germanium (SiGe).

11. The non-planar semiconductor transistor of claim 8, wherein the semiconductor substrate comprises a bulk silicon substrate, and wherein the semiconductor material of the shaped epitaxial structures comprises Germanium (Ge).

12. The non-planar semiconductor transistor of claim 8, wherein the semiconductor substrate comprises a bulk silicon substrate, and wherein the semiconductor material of the shaped epitaxial structures comprises one of Phosphorus doped Silicon Carbon (SiC:P) and Phosphorus doped Si.

13. The semiconductor structure of claim 8, wherein the at least one cycle comprises a plurality of cycles of annealing followed by further epitaxial growth.

14. A semiconductor structure, comprising:
a semiconductor substrate;
a plurality of raised semiconductor structures coupled to the substrate;
a plurality of shaped epitaxial structures of a semiconductor material on top surfaces of the plurality of raised semiconductor structures, wherein the shaped epitaxial structures on adjacent raised structures are separated by a space, and wherein the shaped epitaxial structures are modified as compared to an initial cycle of epitaxial growth to have greater volume and greater space between adjacent shaped epitaxial structures; and
wherein the semiconductor material of the shaped epitaxial structures comprises Phosphorus doped Silicon Carbon (SiC:P).

* * * * *

UNITED STATES PATENT AND TRADEMARK OFFICE
CERTIFICATE OF CORRECTION

PATENT NO. : 9,165,767 B2  
APPLICATION NO. : 14/071170  
DATED : October 20, 2015  
INVENTOR(S) : Krishnan et al.

Page 1 of 1

It is certified that error appears in the above-identified patent and that said Letters Patent is hereby corrected as shown below:

In the Claims

Column 6, Line 62: Claim 1, Delete "cycle of"

Signed and Sealed this
Twenty-second Day of March, 2016

Michelle K. Lee
*Director of the United States Patent and Trademark Office*